United States Patent
Okumura et al.

(10) Patent No.: US 10,115,565 B2
(45) Date of Patent: *Oct. 30, 2018

(54) PLASMA PROCESSING APPARATUS AND PLASMA PROCESSING METHOD

(71) Applicant: Panasonic Corporation, Osaka (JP)

(72) Inventors: Tomohiro Okumura, Osaka (JP); Ichiro Nakayama, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/782,625

(22) Filed: Mar. 1, 2013

(65) Prior Publication Data

US 2013/0230990 A1    Sep. 5, 2013

(30) Foreign Application Priority Data

Mar. 2, 2012   (JP) .................. 2012-046205
Apr. 11, 2012  (JP) .................. 2012-089789
Sep. 18, 2012  (JP) .................. 2012-204067

(51) Int. Cl.
*H01J 37/32*      (2006.01)
*H01L 21/268*     (2006.01)
(Continued)

(52) U.S. Cl.
CPC .......... *H01J 37/321* (2013.01); *H01L 21/268* (2013.01); *H05H 1/30* (2013.01); *H05H 2001/4667* (2013.01)

(58) Field of Classification Search
CPC ............. H05H 1/30; H05H 2001/4652; H05H 2001/4667; H01L 21/268; H01J 37/321–37/32119
(Continued)

(56) References Cited

U.S. PATENT DOCUMENTS 4,431,898 A    2/1984  Reinberg
H566 H   *    1/1989  Nyaiesh et al. .......... 427/571
(Continued)

FOREIGN PATENT DOCUMENTS

JP    58-45736 A    3/1983
JP    04-284974 A   10/1992
(Continued)

OTHER PUBLICATIONS

S. Higashi et al "Crystallization of Si in Millisecond Time Domain Induced by Thermal Plasma Jet Irradiation" Japanese Journal of Applied Physics; vol. 45, No. 5B; 2006; pp. 4313-4320.
(Continued)

*Primary Examiner* — Benjamin Kendall

(74) *Attorney, Agent, or Firm* — Pearne & Gordon LLP

(57) ABSTRACT

According to the invention, there is provided a plasma processing apparatus which can generate plasma stably and efficiently, and can efficiently treat all of the desired regions to be treated of a base material within a short period of time. Provided is a plasma processing apparatus including an opening portion having an opening width of 1 mm or more; a dielectric member that defines a circular chamber constituting a circular space which communicates the opening; a gas supply pipe that introduces gas into an inside of the circular chamber; a coil that is provided in a vicinity of the circular chamber; a high-frequency power supply that is connected to the coil; and a base material mounting table on which a base material is disposed near the opening.

10 Claims, 18 Drawing Sheets

(51) Int. Cl.
  *H05H 1/30* (2006.01)
  *H05H 1/46* (2006.01)

(58) Field of Classification Search
  USPC ............ 156/345.33, 345.35, 345.48, 345.49
  See application file for complete search history.

(56) References Cited

U.S. PATENT DOCUMENTS

| | | | |
|---|---|---|---|
| 5,908,565 A | 6/1999 | Morita et al. | |
| 5,993,594 A | 11/1999 | Wicker | |
| 6,262,386 B1 | 7/2001 | Fornsel et al. | |
| 6,265,690 B1 | 7/2001 | Fornsel et al. | |
| 6,312,554 B1* | 11/2001 | Ye | 156/345.38 |
| 2003/0015293 A1 | 1/2003 | Obuchi | |
| 2004/0264044 A1 | 12/2004 | Konishi | |
| 2005/0093460 A1* | 5/2005 | Kim | H01J 37/321 315/111.21 |
| 2005/0145173 A1* | 7/2005 | Holber | H01J 37/32009 118/723 E |
| 2006/0226119 A1* | 10/2006 | Kannan | B08B 7/0035 216/67 |
| 2006/0289409 A1 | 12/2006 | Choi et al. | |
| 2007/0137576 A1 | 6/2007 | Kurunczi et al. | |
| 2007/0243338 A1* | 10/2007 | Aslami et al. | 427/569 |
| 2007/0245963 A1 | 11/2007 | Choi | |
| 2008/0023070 A1 | 1/2008 | Sinha | |
| 2009/0229756 A1 | 9/2009 | Nakajima | |
| 2010/0025821 A1 | 2/2010 | Ohmi | |
| 2010/0178435 A1* | 7/2010 | Ervin et al. | 427/569 |
| 2011/0005681 A1* | 1/2011 | Savas et al. | 156/345.33 |
| 2011/0045205 A1* | 2/2011 | Rostaing et al. | 427/576 |
| 2012/0021132 A1 | 1/2012 | Shimizu | |
| 2012/0058649 A1 | 3/2012 | Okumura et al. | |
| 2012/0325777 A1 | 12/2012 | Okumura et al. | |
| 2013/0115780 A1 | 5/2013 | Okumura et al. | |

FOREIGN PATENT DOCUMENTS

| | | | |
|---|---|---|---|
| JP | 08-118027 A | | 5/1996 |
| JP | 10-098033 | * | 4/1998 |
| JP | 11-251090 A | | 9/1999 |
| JP | 2001-068298 A | | 3/2001 |
| JP | 2001-093871 A | | 4/2001 |
| JP | 2002-008895 A | | 1/2002 |
| JP | 2002-500818 A | | 1/2002 |
| JP | 2003-33647 A | | 2/2003 |
| JP | 2004-047192 A | | 2/2004 |
| JP | 2004095663 A | | 3/2004 |
| JP | 2005-18844 A | | 1/2005 |
| JP | 2005-203209 A | | 7/2005 |
| JP | 2006-297339 A | | 11/2006 |
| JP | 2006-332055 A | | 12/2006 |
| JP | 2007-250444 A | | 9/2007 |
| JP | 2007-287454 A | | 11/2007 |
| JP | 2007-294414 A | | 11/2007 |
| JP | 2008-053634 A | | 3/2008 |
| JP | 2008-159928 A | | 7/2008 |
| JP | 2009-520324 A | | 5/2009 |
| JP | 2009-158251 A | | 7/2009 |
| JP | 2009-238485 A | | 10/2009 |
| JP | 2009-545165 A | | 12/2009 |
| JP | 2010-251163 A | | 4/2010 |
| JP | 2010-539336 A | | 12/2010 |
| JP | 2012-174499 A | | 9/2012 |
| JP | 2012-174500 A | | 9/2012 |
| JP | 2013-120685 A | | 6/2013 |
| JP | 2013-211244 A | | 10/2013 |
| KR | 10-0615067 B1 | | 8/2006 |
| WO | 2007/034747 A1 | | 3/2007 |
| WO | 2008/023523 A1 | | 2/2008 |
| WO | 2011/142125 A1 | | 11/2011 |

OTHER PUBLICATIONS

H. Yabuta et al "Design and evaluation of dual inlet ICP torch for low gas consumption" The Royal Society of Chemistry; Mar. 2002; pp. 1090-1095.

* cited by examiner

PLASMA PROCESSING APPARATUS AND PLASMA PROCESSING METHOD

This application is entitled to the benefit of the Japanese Patent Applications No. 2012-046205, filed Mar. 2, 2012, No. 2012-089789, filed Apr. 11, 2012, No. 2012-204067, filed Sep. 18, 2012, the entire contents of which are incorporated by reference herein.

TECHNICAL FIELD

The present invention relates to a plasma processing apparatus and a plasma processing method. Specifically, the invention relates to a thermal plasma processing in which a base material is irradiated with thermal plasma so as to treat the base material and a low-temperature plasma processing in which a base material is irradiated with plasma from reaction gas or plasma and a reaction gas flow at the same time so as to treat the base material, or relates to an apparatus for performing the same.

BACKGROUND ART

In the past, a semiconductor thin film such as polycrystalline silicon (poly-Si) was widely used for thin film transistors (TFT) or solar cells. In particular, poly-Si TFT having high carrier mobility can be manufactured on a transparent insulating substrate such as a glass substrate. Using such characteristics, poly-Si TFT is widely used for, for example, a switching element that constitutes a pixel circuit such as a liquid crystal display apparatus, a liquid crystal projector, or an organic EL display apparatus, or a circuit element of a liquid crystal driver.

As a method of manufacturing a high-performance TFT on a glass substrate, a manufacturing method termed a "high-temperature process" is generally used. Among TFT-manufacturing processes, a process in which the peak temperature is approximately 1000° C. is generally termed the "high-temperature process." The characteristics of the high-temperature process include a capability of forming a relatively favorable polycrystalline silicon film using the solid-phase growth of silicon, a capability of obtaining a favorable gate insulating layer using thermal oxidation of silicon, and a capability of forming an interface between pure polycrystalline silicon and the gate insulating layer. In the high-temperature process, a high-performance TFT having high mobility and high reliability can be stably manufactured due to the above characteristics.

On the other hand, the high-temperature process is a process for crystallizing a silicon film using solid-phase growth. Therefore, in the high-temperature process, it is necessary to perform a treatment for a long period of time of approximately 48 hours. Since the above process takes a significantly long process, in order to increase the throughput of the process, a number of thermal treatment furnaces are inevitably required and it is difficult to reduce the cost. Additionally, in order to perform the high-temperature process, A quartz glass has to be used as the highly heat-resistant insulating substrate. Therefore, the cost for a substrate is high, which does not make an increase in the size suitable.

Meanwhile, among TFT-manufacturing processes, a process in which a poly-Si TFT is manufactured on a relatively cheap heat-resistant glass substrate under a temperature environment in which the peak temperature is approximately 600° C. or lower is generally termed the "low-temperature process." In the low-temperature process, a laser crystallization technique in which a silicon film is crystallized using a pulse laser having an extremely short oscillation time is widely used. Laser crystallization refers to a technique using a property of a silicon film in a process in which the silicon thin film on a substrate is irradiated with a high-output pulse laser ray so as to be instantly melted, and crystallized in the process of solidifying.

In order to overcome the problems of the limitation on the size of the substrate and the large apparatus costs, a crystallization technique termed a "thermal plasma jet crystallization method" is being studied (for example, refer to NPL 1). Hereinafter, this thermal plasma jet crystallization method will be described simply.

A tungsten (W) anode and a water-cooled copper (Cu) cathode are disposed opposite to each other, and an arc discharge is generated between both electrodes when a DC voltage is applied. When argon gas is made to flow between the electrodes under atmospheric pressure, thermal plasma is ejected from an ejection hole opened in the copper cathode. The thermal plasma refers to thermal equilibrium plasma, and is an ultra high-temperature heat source in which ions, electrons, neutral atoms, and the like have substantially the same temperature which is approximately 10000 K. Due to the above fact, the thermal plasma can easily heat matter to a high temperature. An a-Si film can be crystallized by scanning the entire surface of a substrate having the a-Si film deposited thereon with ultra high-temperature thermal plasma at a high rate.

As such, in the thermal plasma jet crystallization method, the apparatus configuration is extremely simple, and crystallization is achieved under atmospheric pressure in the process. In addition, it is not necessary to cover the apparatus with an expensive member such as a sealed chamber, and a significant decrease in the apparatus costs can be expected. In addition, since utilities necessary for crystallization are argon gas, electric power, and cooling water, the crystallization technique also has a low running cost.

FIG. 17 is a schematic diagram for explaining a method of crystallizing a semiconductor film using the thermal plasma jet crystallization method. In FIG. 17, thermal plasma-generating apparatus 31 has anode 32 and cathode 33 which is disposed opposite to anode 32 with a predetermined distance therebetween. Anode 32 is constituted by, for example, a conductor such as tungsten. Cathode 33 is constituted by, for example, a conductor such as copper. In addition, cathode 33 is formed to be hollow, and is configured to allow water to pass through the hollow portion so as to make cooling possible.

Ejection hole (nozzle) 34 is provided in cathode 33. When a direct (DC) voltage is applied between anode 32 and cathode 33, an arc discharge is generated between both electrodes. When gas such as argon gas is made to flow between anode 32 and cathode 33 under atmospheric pressure in the above state, it is possible to eject thermal plasma 35 from ejection hole 34.

The thermal plasma can be used for a thermal treatment for crystallization of a semiconductor film. Specifically, semiconductor film 37 (for example, an amorphous silicon film) is formed on substrate 36, and thermal plasma (thermal plasma jet) 35 is made to irradiate semiconductor film 37. Thermal plasma 35 is made to irradiate semiconductor film 37 while relatively moving along the first axis (the horizontal direction in the example shown in the drawing) that is parallel to the surface of semiconductor film 37. That is, thermal plasma 35 is made to irradiate semiconductor film 37 while scanning in the first axial direction. Using the scanning of thermal plasma 35, semiconductor film 37 is heated due to a high temperature of thermal plasma 35, and crystallized semiconductor film 38 (a polysilicon film in the present example) is obtained (for example, refer to PTL 1).

FIG. 18 is a conceptual view showing the relationship between the depth from the outermost surface and the temperature of semiconductor film 37 which is irradiated with thermal plasma 35. As shown in FIG. 18, it is possible to treat only the vicinity of the surface of semiconductor film 37 at a high temperature by moving the thermal plasma 35 at a high rate. Since the regions irradiated with thermal plasma 35 are rapidly cool after being irradiated, the vicinity of the surface remains at a high temperature for an extremely short period of time.

The thermal plasma is generally made to irradiate dotted regions. The thermal plasma is maintained using thermionic emission from anode 32. The thermionic emission becomes more active at locations having a high plasma density. That is, the arc discharge is generated intensely at one point in the anode, and the thermal plasma is generated in dotted regions. In this way, the thermal plasma being selectively generated in dotted lines refers to a positive feedback being applied.

In a case in which it is necessary to uniformly crystallize a semiconductor film formed on a tabular base material using thermal plasma, it is necessary to scan dotted thermal plasma across the entire base material multiple times. In order to build a process in which the number of times of scanning is reduced so that a treatment can be performed within a shorter period of time, it is effective to widen the irradiation region of the thermal plasma. Therefore, thus far, techniques that generate thermal plasma in a large area have been studied.

For example, a plasma torch including a plasma jet nozzle and a broadened gas nozzle (for example, refer to PTL 2), and a method is disclosed in which a plasma jet irradiated from the plasma jet nozzle is widened by gas ejected from the broadened gas nozzle.

Alternatively, a plasma torch is disclosed in which an opening portion of a plasma nozzle is inclined with respect to a core of a nozzle path (for example, refer to PTL 3). In addition, a method is disclosed in which a casing or part of the casing that constitutes the nozzle path is rotated about the core at a high rate.

In addition, a plasma torch provided with a rotary head having an eccentrically disposed plasma nozzle is disclosed (for example, refer to PTL 4).

Although not aiming to treat a large area within a short period of time, a high-speed gas shield are welding method, characterized in that band-shaped electrodes are used, and disposed so that the width direction forms the welding line direction and welding is performed, is disclosed as a welding method using the thermal plasma (for example, refer to PTL 5).

In addition, an induction coupling-type plasma torch provided with a plasma chamber composed of a flat rectangular insulating material having a linear thin and long shape is disclosed (for example, refer to PTLS 6 and 7). A plasma flood gun of an ion implantation system which includes a plasma chamber having a rectangular space is disclosed (for example, refer to PTLS 8 and 9).

Meanwhile, a method of generating thin and long linear plasma in which long electrodes are used is disclosed (for example, refer to PTL 10). Although described to generate thermal plasma, the method is to generate low-temperature plasma, and is not a configuration appropriate for a thermal treatment. If the thermal plasma is generated, since the method is a capacity coupling-type in which electrodes are used, it is assumed that an arc discharge is focused at one place, and it is difficult to generate uniform thermal plasma in the longitudinal direction. Meanwhile, as a low-temperature plasma processing apparatus, an apparatus with which a plasma processing such as etching or film formation is possible by plasmatizing etching gas or chemical vapor deposition (CVD) gas is used.

In addition, a method in which long plasma is generated using a micro strip line is disclosed (for example, refer to PTL 11). In this configuration, since the chamber wall surface with which the plasma comes into contact may not be completely cooled (not surrounded by a water cooling path), it is considered that the configuration may not work as a thermal plasma source.

In addition, an apparatus in which a plurality of discharge electrodes are arrayed linearly so as to form a linear long plasma torch is discloses (for example, refer to PTL 12).

CITATION LIST

Patent Literature

PTL 1: Japanese Patent Application Laid-Open No. 2008-53634
PTL 2: Japanese Patent Application Laid-Open No. HEI 08-118027
PTL 3: Japanese Patent Application Laid-Open No. 2001-68298
PTL 4: Japanese Translation of a PCT Application Laid-Open No. 2002-500818
PTL 5: Japanese Patent Application Laid-Open No. HEI 04-284974
PTL 6: Japanese Translation of a PCT Application Laid-Open No. 2009-545165
PTL 7: U.S. Patent Application Publication No. 2010/0178435
PTL 8: Japanese Translation of a PCT Application Laid-Open No. 2009-520324
PTL 9: U.S. Patent Application Publication No. 2007/0137576
PTL 10: Japanese Patent Application Laid-Open No. 2007-287454
PTL 11: Japanese Translation of a PCT Application Laid-Open No. 2010-539336
PTL 12: Japanese Patent Application Laid-Open No. 2009-158251

Non-Patent Literature

NPL 1: S. Higashi, H. Kaku, T. Okada, H. Murakaini and S. Miyazaki; Jpn. J. Appl. Phys. 45, 5B (2006) pp. 4313-4320

SUMMARY OF INVENTION

Technical Problem

In order to crystallize a semiconductor film, is necessary to treat the vicinity of a surface of the semiconductor film at a high temperature only for an extremely short period of time. However, the techniques of the related art for generating thermal plasma in a large area were not effective for crystallization of a semiconductor.

In a plasma processing appropriate for a large-area treatment, it is considered that linear thermal plasma or dotted thermal plasma having a large diameter irradiated is used. However, when the diameter of dotted thermal plasma is large, the time for which the thermal plasma passes above the base material during scanning substantially increases. Therefore, it is not possible to treat only the vicinity of the surface of the base material at a high temperature only for an extremely short period of time. As a result, the base material reaches a high temperature even in a very deep region, and there are cases in which a disadvantage, for example, cracking or peeling of the glass substrate occurs.

In the technique for generating thermal plasma in a large area which is described in PTL 2 in the examples of the related art, the thermal plasma is widened, but the temperature distribution of the widened thermal plasma becomes 100° C. or higher, and a uniform thermal treatment may not be realized.

The techniques for generating thermal plasma in a large area which are described in PTLS 3 and 4 are essentially to oscillate thermal plasma. Therefore, the substantial thermal treatment time becomes short compared to a case in which thermal plasma is scanned without rotating the casing or the rotary head. Accordingly, the time for treating a large area does not become particularly short. In addition, for a uniform treatment, it is necessary to sufficiently increase the rotation rate compared to the scanning rate, and there is no way of avoiding the configuration of the nozzle becoming complex.

The technique described in PTL 5 is a welding technique, which is not a configuration for a uniform treatment of a large area. Even when the welding technique described in PTL 5 is applied to use of a large area treatment, since the dotted arcs vibrate along the band-shaped electrodes, non-uniform plasma is generated instantly. Therefore, the technique may not be applied to a uniform treatment of a large area.

The technique described in PTL 12 has disadvantages of poor stability of thermal plasma (large variation over time) and much contamination of the electrode materials into the base material compared to an induction coupling-type high-frequency plasma torch described below.

On the other hand, in the technique described in PTLS 6 and 7, an induction coupling-type high-frequency plasma torch is used. Since an electrodeless discharge is generated in the induction coupling-type high-frequency plasma torch, the technique has advantages of excellent stability of thermal plasma (small variation over time) and little contamination of electrode materials into the base materials.

In the induction coupling-type plasma torch, an insulating material configures double tubes, and a cooling medium is made to flow between the double tubes in order to protect the insulating material from high-temperature plasma. The plasma torch described in PTLS 6 and 7 has a flat rectangular plasma chamber constituted by the insulating material. It is not possible for a sufficient flux of a cooling medium to flow by simply employing a plasma chamber using the insulating material having the double tube configuration. This is because the insulating material generally has a poor mechanical strength compared to metal, and, when the insulating material is made to be long in the longitudinal direction, it becomes impossible to increase the acceptable internal pressure of the double tubes. Therefore, there is a limitation on a uniform treatment of a large area.

An induction coupling-type high-frequency plasma torch described in PTLS 6 and 7 and having a cylindrical chamber was put into practical use for analysis or irradiating. However, there were disadvantages that the plasma generation efficiency was poor, and the discharge became unstable when the gas flux increased.

According to the present invention, there is provided a plasma processing apparatus for a high-temperature plasma processing in which the vicinity of the surface of the base material is uniformly treated thermally only for a short period of time or a low-temperature plasma processing in which the base material is irradiated with plasma from reaction gas or plasma and a reaction gas flow at the same time. As a result, there is provided a plasma processing apparatus which can generate plasma stably and efficiently, and can efficiently treat all of the desired regions to be treated of a base material within a short period of time.

Solution to Problem

According to a first invention of the present application, there is provided a plasma processing apparatus including: a dielectric member that defines a circular chamber constituting a circular space which communicates an opening portion having an opening width of 1 mm or more; a gas supply pipe that introduces gas into an inside of the circular chamber; a coil that is provided in a vicinity of the dielectric member defining the circular chamber; a high-frequency power supply that is connected to the coil; and a base material mounting table that is configured to be mounted with a base material near the opening.

With such a configuration, plasma can be generated stably and efficiently. As a result, a high-temperature plasma processing in which the vicinity of the surface of the base material is uniformly treated thermally at a high temperature only for a short period of time can be performed. Alternatively, a low-temperature plasma processing in which the base material is irradiated with plasma and gas at the same time can be performed.

In the plasma processing apparatus according to the first invention of the present application, it is preferable that the circular chamber have a long shape; the opening portion have a long and linear shape; the coil have a long shape in parallel with a longitudinal direction of the opening; and a moving mechanism, that is configured to move the chamber relative to the base material mounting table perpendicularly with respect to the longitudinal direction of the opening, be provided. With such a configuration, all of the desired regions to be treated of a base material can be treated within a short period of time.

In the plasma processing apparatus according to the first invention of the present application, it is preferable that a length of the opening be shorter than a long axis diameter of the circular space constituted by the circular chamber. With such a configuration, plasma can be generated more stably and the uniformity of the plasma processing can be improved.

It is preferable that the plasma processing apparatus according to the first invention of the present application further include a cooling medium path that is provided in parallel with the longitudinal direction of the opening portion in an inside of the dielectric member; or a dielectric tube that is joined to the dielectric member, is disposed in parallel with the longitudinal direction of the opening, and has an inside forming an cooling medium path. With such a configuration, the dielectric member can be cooled efficiently.

In the plasma processing apparatus according to the first invention of the present application, it is preferable that the dielectric member have an outside dielectric block that defines an outside boundary of the circular space and an inside dielectric block that is inserted into the outside dielectric block and defines an inside boundary of the circular space. With such a configuration, the configuration of the plasma processing apparatus is simplified.

In the plasma processing apparatus according to the first invention of the present application, it is preferable that a distance between an end surface of the opening and a base material be 1 mm or less. With such a configuration, plasma can be generated more stably and efficiently.

In the plasma processing apparatus according to the first invention of the present application, it is preferable that a width of the circular space constituted by the circular chamber be 1 mm or more and 10 mm or less. With such a configuration, plasma can be generated more stably.

In the plasma processing apparatus according to the first invention of the present application, it is preferable that the opening width of the opening be the same as a width of the circular space constituted by the circular chamber. With such a configuration, all of the desired regions to be treated of a base material can be treated within a short period of time.

In the plasma processing apparatus according to the first invention of the present application, it is preferable that a long axis diameter of the circular space constituted by the circular chamber is 10 mm or more. With such a configuration, plasma can be generated more stably.

In the plasma processing apparatus according to the first invention of the present application, it is preferable that the opening width of the opening be varied. With such a configuration, a plasma processing apparatus which can perform a variety of plasma processes can be provided.

It is preferable that the plasma processing apparatus according to the first invention of the present application further include a planar cover that is provided in a vicinity of the base material mounting table so as to surround an edge portion of a base material when the base material is mounted on the base material mounting table. With such a configuration, plasma can be generated more stably.

In addition, in this case, it is preferable that a surface of the cover and a surface of the base material mounted on the base material mounting table be disposed on the same plane. With such a configuration, plasma can be generated more stably.

In addition, in this case, it is more preferable that at least a surface of the cover be formed of an insulating material. With such a configuration, plasma can be generated more stably.

According to a second invention of the present application, there is provided a plasma processing method of a surface of a base material, the method including: a step of supplying gas into a circular chamber, in which portions other than an opening portion are constituted by a circular space surrounded by a dielectric member, while supplying a high-frequency electric power to a coil, which is provided in a vicinity of the circular chamber, so as to generate a high-frequency electromagnetic field and plasma in the circular chamber; and a step of exposing a base material, which is disposed opposite to the opening in a vicinity of the opening, to the plasma.

With such a configuration, plasma can be generated stably and efficiently. As a result, a high-temperature plasma processing in which the vicinity of the surface of the base material is uniformly treated thermally only for an extremely short period of time, or a low-temperature plasma processing in which the base material is irradiated with plasma from reaction gas or plasma and a reaction gas flow at the same time can be performed.

In the plasma processing method according to the second invention of the present application, it is preferable that an insulating film be formed on the surface of the base material exposed to the plasma. With such a configuration, a more stable plasma processing can be performed.

Advantageous Effects of Invention

According to the present invention, plasma can be generated stably and efficiently. In addition, a high-temperature plasma processing in which the vicinity of the surface of the base material is uniformly treated thermally at a high temperature only for an extremely short period of time, or a low-temperature plasma processing in which the base material is irradiated with plasma or plasma and a reaction gas flow at the same time can be performed using a generated plasma. Furthermore, all of the desired regions to be treated of a base material can be treated within a short period of time.

DESCRIPTION OF EMBODIMENTS

Hereinafter, plasma processing apparatuses according to Embodiments of the present invention will be described with reference to the drawings.

Embodiment 1

Embodiment 1 will be described with reference to FIGS. 1 to 3. FIGS. 1 to 3 show a configuration of a plasma processing apparatus according to Embodiment 1. The plasma processing apparatus includes induction coupling-type plasma torch unit T and base material mounting table 1. Base material 2 to be treated with plasma is mounted on base material mounting table 1. Plasma torch unit T is surrounded by a wholly grounded shielding member (not shown) made of a conductor so that the leakage (noise) of high frequencies from plasma torch unit T can be effectively prevented, and an abnormal discharge and the like which are not preferable can be effectively prevented.

Figure 1A:
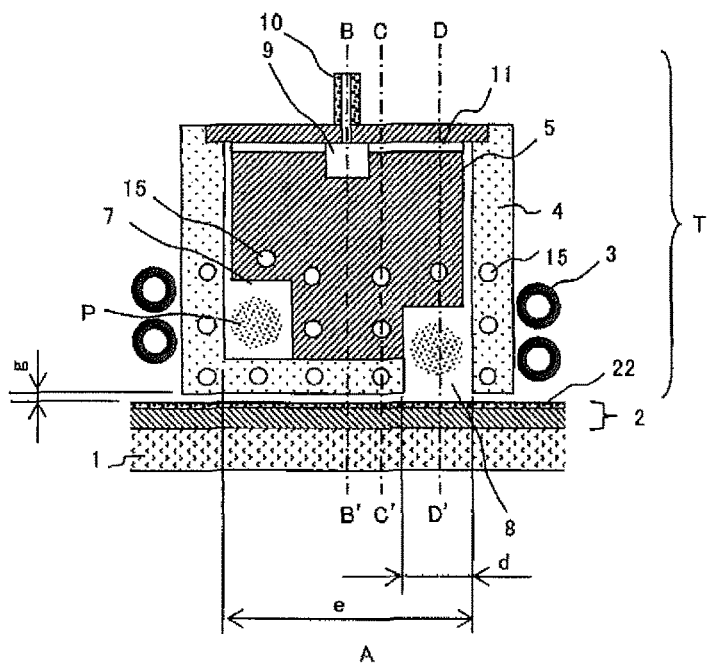
FIGS. 1A to 1D are cross-sectional views showing a configuration of a plasma processing apparatus according to Embodiment 1.
Figure 1B:
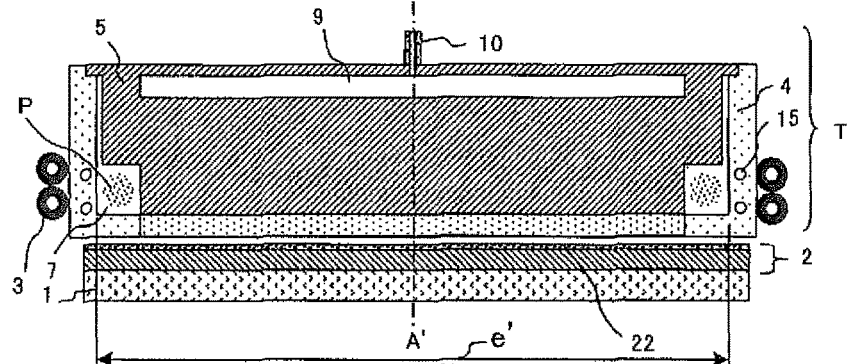
Figure 1C:
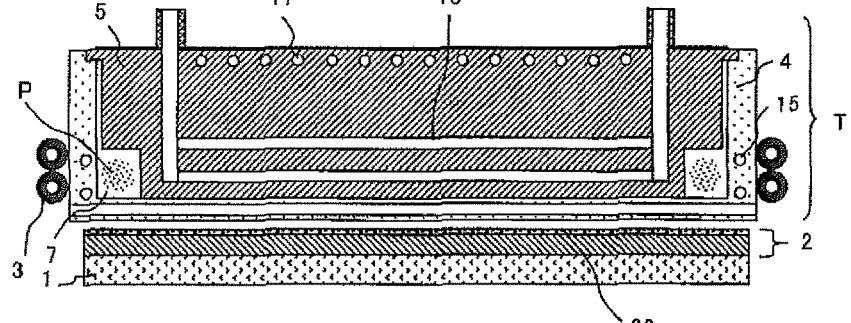
Figure 1D:
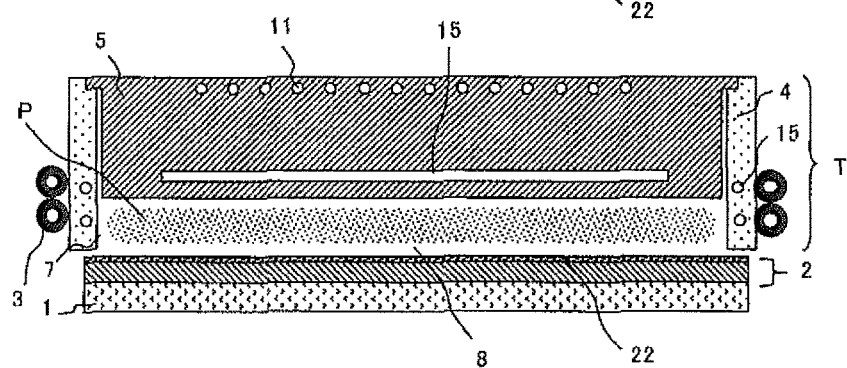
Figure 2A:
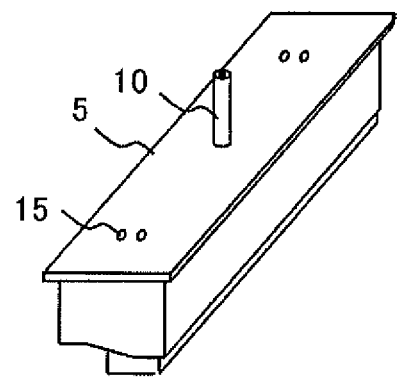
FIGS. 2A to 2C are perspective views showing a configuration of the plasma processing apparatus according to Embodiment 1.
Figure 2B:
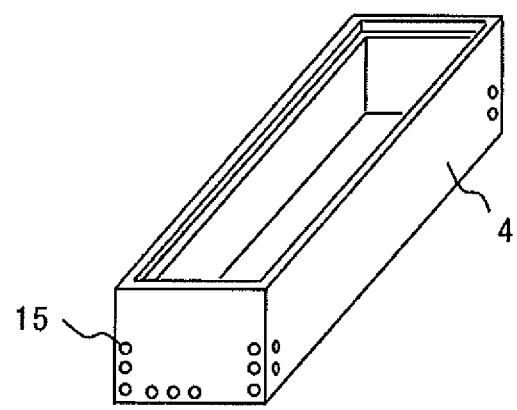
Figure 2C:
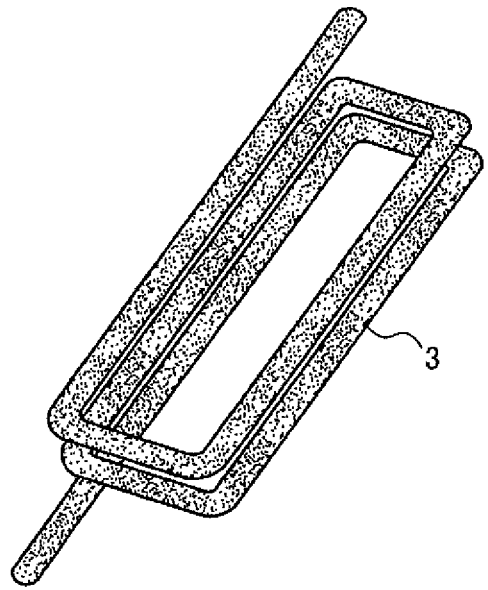
Figure 3:
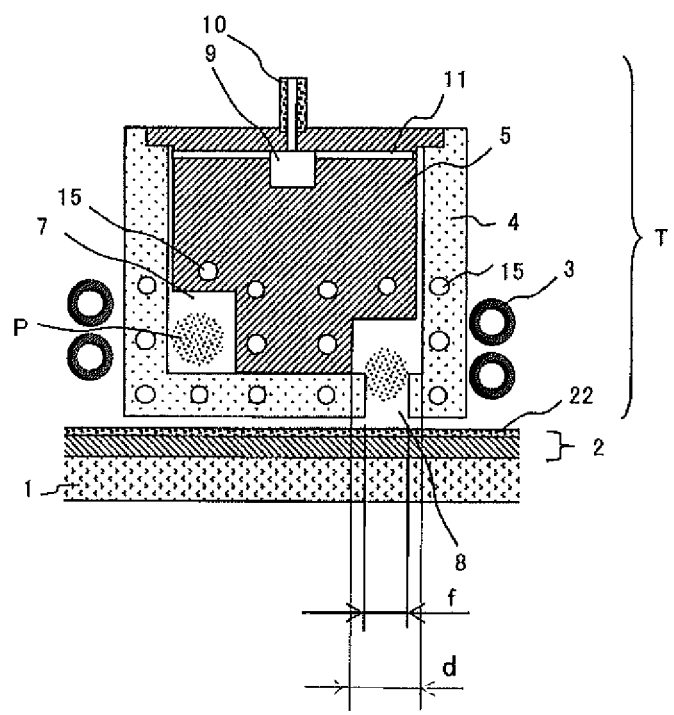
FIG. 3 is a cross-sectional view showing a configuration of the plasma processing apparatus according to Embodiment 1.

As shown in FIGS. 2A to 2C, plasma torch unit T includes first quartz block 4, second quartz block 5, and solenoid coil 3. FIGS. 2A to 2C are perspective views of first quarts block 4, second quartz block 5, and solenoid coil 3. Second quartz block 5 is inserted into an inside of first quartz block 4, and solenoid coil 3 is disposed so as to surround first quartz block 4. By inserting second quartz block 5 into first quartz block 4, a circular chamber constituting circular space 7 is defined (refer to FIG. 1).

FIGS. 1A to 1C are cross-sectional views of plasma torch unit T. FIG. 1A is a cross-sectional view which is perpendicular to a longitudinal direction of plasma torch unit T and is perpendicular to a mounting surface of base material mounting table 1. FIGS. 1B, 1C, and 1D are cross sectional views which are in parallel with the longitudinal direction of plasma torch unit T and are perpendicular to the mounting surface of base material mounting table 1.

In addition, FIG. 1A is a cross-sectional view taken along broken line A-A' of FIG. 1B. FIG. 1B is a cross-sectional view taken along broken line B-B' of FIG. 1A; FIG. 1C is a cross-sectional view taken along broken line C-C' of FIG. 1A; and FIG. 1D is a cross-sectional view taken along broken line D-D' of FIG. 1A.

As shown in FIG. 1A, the circular chamber constituting circular space 7, which is defined by first quartz block 4 and second quartz block 5, communicates an external space through opening portion 8. Base material 2, mounted on base material mounting table 1, is disposed in the vicinity of opening portion 8, and base material 2 and opening portion 8 face to each other.

The circular chamber constituting circular space 7 is surrounded by an outer wall surface of second quartz block 5 which serves as an inside dielectric block and an inner wall surface of first quartz block 4 which serves as an outside dielectric block into which the inside dielectric block is inserted. That is, portions of the circular chamber other than opening portion 8 are surrounded by a dielectric member. "Circular" described herein represents having a loop-shape, in which first and end points are the same, and is not limited to a circle.

Circular space 7 of plasma torch unit T according to Example 1 has a racetrack shape having a long axis diameter and a short axis diameter. The racetrack shape represents a shape having straight portions constituted by two long sides and two short sides connected to both ends of the straight portions. Two short sides may be semicircular, semielliptical, or linear.

Plasma gas manifold 9 is provided inside second quartz block 5 (refer to FIGS. 1A and 1B). Gas is supplied from plasma gas supply pipe 10 to plasma gas manifold 9. The supplied gas is introduced into circular space 7, which is constituted by the circular chamber, through plasma gas supply hole 11 (penetrating hole) which is provided in second quartz block 5. With such a configuration, gas can be uniformly supplied into a longitudinal region of circular space 7 constituted by the circular chamber. The flux of gas supplied from plasma gas supply pipe 10 is controlled using a flux control apparatus such as a mass flow controller provided upstream.

A plurality of plasma gas supply holes 11 shown in FIGS. 1A, 1C, and 1D are penetrating holes having a round cross-section and are provide along a longitudinal direction of the plasma torch unit. However, plasma gas supply hole 11 may be a long slit.

Gas supplied to the circular chamber is not particularly limited. An inert gas-dominant gas is desirable in consideration of the safety and ignition properties of plasma, the service life of members exposed to plasma, and the like. Among the above, argon (Ar) gas is typically used. In a case in which plasma is generated using only Ar, the plasma reaches a significantly high temperature (10,000 K or higher).

A plurality of cooling medium paths 15 are provided in first quartz block 4 and second quartz block 5 to extend in a longitudinal direction of opening portion 8 (FIGS. 1A, 1C, and 1D). In addition, cooling medium paths 15 are provided in first quartz block 4 to extend in a direction perpendicular to the longitudinal direction of opening portion 8 (FIGS. 1B, 1C, and 1D). These cooling medium paths communicate a supply opening for supplying a cooling medium from the outside and an discharge opening for discharging a cooling medium to the outside. That is, cooling medium path 15 is branched in second quartz block 5.

If cooling medium paths 15 are round in the cross section, it is hard for the component members to deform due to the internal pressure when a large amount of a cooling medium flows. That is, compared to the case of the technique described in PTLS 6 and 7 in which the plasma torch unit adopts the double-tube configuration and a cooling medium is made flow between the double tubes, in the plasma torch unit according to Embodiment 1, it is possible to make a far larger amount of a cooling medium flow. As a result, effective cooling can be performed.

Solenoid coil 3 made of a conductor is disposed in the vicinity of plasma torch unit T. The inner wall surface of the circular chamber near solenoid coil 3 is a curved surface in parallel with a curved surface that constitutes the solenoid coil 3. The above configuration makes the distance from solenoid coil 3 to the circular chamber constant. As a result, it becomes possible to generate induction coupling plasma using a small high-frequency electric power, and plasma can be efficiently generated.

Solenoid coil 3 is made of a hollow copper tube, and the hollow portion forms a cooling medium path. It becomes possible to cool plasma torch unit T by making a cooling medium such as water flow through the hollow portion.

As described above, circular space 7 constituted by the circular chamber communicate the outside through linear rectangular opening portion 8. Opening portion 8 and base material mounting table 1 (or base material 2 on base material mounting table 1) face to each other.

As shown in FIGS. 1A and 1D, opening portion 8 is disposed along a side in the longitudinal direction of the circular chamber. Opening width f (refer to FIG. 3) of opening portion 8 is the same as width d of circular space 7 forming the circular chamber (gap between the outside surface and inside surface of the circular space). Plasma P generated in circular space 7 comes into contact with base material 2 through opening portion 8.

In plasma torch unit T according to Embodiment 1, one linear opening portion 8 is disposed along one long side of the circular chamber. When the length of the racetrack forming the circular chamber is represented by L1, the length of the straight line forming the long side is represented by L2, and the length of the circle, ellipse, or straight line forming the short side is represented by L3, a relationship of $L1=L2\times2+L3\times2$ is satisfied. In addition, when the length of opening portion 8 is represented by L4, a relationship of $L4<L1$ is satisfied because $L4 \approx L2$. That is, the length L4 of linear opening 8 is shorter than the length L1 of the circular chamber.

By reducing an area in which plasma P generated in a region surrounded by the dielectric member is in contact with base material 2 which is a material other than the dielectric material, the stability of plasma P is generally improved. In addition, there is a concern that the uniformity of plasma P generated in the short side of the circular chamber is lower than that of plasma P generated in the long side of the circular chamber. By irradiating the base material 2 with high-uniformity plasma P generated in the long side, the uniformity of the plasma processing can be improved.

Gas is ejected to base material 2 through opening portion 8 while supplying gas from plasma gas supply pipe 10 to circular space 7 constituted by the circular chamber. At the same time, a high-frequency electric power is supplied to solenoid coil 3 by a high-voltage power supply (not shown). As a result, plasma P is generated in circular space 7 constituted by the circular chamber. Base material 2, which is disposed in the vicinity of opening portion 8, is exposed to plasma P and gas. As a result, thin film 22 on base material 2 can be treated with plasma.

Specific examples of process conditions of the plasma processing will be described below. Gas is ejected to base material 2 through opening portion 8 while supplying Ar or gas mixture of Ar and hydrogen into the circular chamber through plasma gas supply hole 11. At the same time, a high-frequency electric power of 13.56 MHz is supplied to solenoid coil 3 by a high-frequency power supply (not shown). As a result, a high-frequency electromagnetic field is generated in internal space 7 of the circular chamber, thereby generating plasma P. By exposing base material 2 near opening portion 8 to plasma P, heat treatment such as crystallization of a semiconductor film can be performed.

By exposing base material 2 to plasma P, the circular chamber and base material mounting table 1 relatively move perpendicularly with respect to the longitudinal direction of opening portion 8. That is, induction coupling-type plasma torch unit T or base material mounting table 1 move in the horizontal direction in FIG. 1A and in the perpendicular direction to the paper surface of FIGS. 1B to 1D.

The circular chamber and base material mounting table 1 relatively move perpendicularly with respect to the longitudinal direction of opening portion 8 while disposing an open surface of opening portion 8 and a mounting surface of base material mounting table 1 in parallel with each other. By adjusting the length of opening portion 8, the length of a plasma irradiation region and the length of a desired region to be irradiated of base material 2 can be configured to be the same.

As the plasma processing conditions, a scanning speed of 50 to 3000 mm/s, a total flux of plasma and gas of 1 to 100 SLM, a concentration of hydrogen in the gas mixture of Ar and hydrogen gas of 0 to 10%, and a high-frequency electric power of 0.5 to 10 kW may be appropriate values. Among these conditions, the gas flux and the electric power are values per the length of opening portion 8 of 100 mm. This is because it is considered to be appropriate that the parameters of the gas flux, the electric power, or the like is proportional to the length of opening portion 8.

As described above, plasma torch unit T according to Embodiment 1 includes the circular chamber constituting circular space 7. Effects obtained by configuring the chamber to be circular will be described.

In PTLS 6 and 7 described in the examples of the related art, the shape of the plasma torch is not disclosed in detail or is constituted by a loaf of space having a cuboid shape. When induction coupling-type plasma is generated in the space having a cuboid shape under atmospheric pressure, tonic (doughnut-shaped) plasma is liable to be generated in the chamber. When tonic plasma is generated in the chamber constituting the space having a cuboid shape, plasma having an extremely high density is generated at only a part in the chamber. Therefore, it is difficult to generate uniform plasma having an elongated shape.

On the other hand, since the chamber of plasma torch unit T according to Embodiment 1 constitutes circular space 7, racetrack-form plasma P is generated along circular space 7. Therefore, compared to the examples of the related art, plasma having a uniform density is generated in the chamber. As a result, significantly uniform plasma processing can be performed.

In addition, the volume of the chamber of plasma torch unit T according to Embodiment 1 is smaller than that of the examples of the related art. Therefore, since the high-frequency electric power exerting per unit volume increases, the plasma generation efficiency improves.

As shown in FIG. 3, opening width f of opening portion 8 of plasma torch unit T according to Embodiment 1 may be different from width d of circular space 7 constituted by the circular chamber (the opening width f may be smaller than the width d). However, when opening width f is too small, it is difficult for base material to be exposed to plasma P. Therefore, it is necessary that opening width f is more than 1 mm. That is, when gap f is 1 mm or less, it is difficult for circular plasma P to enter into opening portion.

In addition, width d of circular space 7 constituted by the circular chamber corresponds to the gap between the inner wall surface of first quartz block 4 and the outer wall surface of second quartz block 5 that constitute plasma torch unit T (refer to FIG. 1A). As a result of investigation by the present inventors, it was found that, when width d of the circular space is less than 1 mm, it becomes extremely difficult to generate high-density thermal plasma in the circular chamber. In addition, it was found that, when width d is too large, that the plasma generation efficiency deteriorates. Therefore, it is preferable that width d be 1 mm or more and 10 mm or less.

Outer diameters (the size of the entire circular chamber) e and e' of the circular chamber correspond to distances between the inner wall surfaces of first quartz block 4 (FIGS.

1A and 1B). The circular chamber has long shape, and thus has short axis diameter e of the circular chamber and long axis diameter e' of the circular chamber. It was found that, when long axis diameter e' of the circular chamber is less than 10 mm, it becomes extremely difficult to generate high-density thermal plasma in the circular chamber. Accordingly, it is preferable that long axis diameter e' among outer diameters of the circular chamber be 10 mm or more.

In plasma torch unit T according to Embodiment 1, gap g (FIG. 1A) between the lower most surface of first quartz block 4 and the surface of base material 2 is reduced, specifically, is preferably 1 mm or less. Effects obtained by reducing gap g will be described.

In an ordinary induction coupling-type plasma torch of the related art, there was a problem in that, when the gas flux increases, a discharge becomes unstable (refer to, for example, Hironobu Yabuta et. al., "Design and evaluation of dual inlet ICP torch for low gas consumption", Journal of Analytical Atomic Spectrometry, 17 (2002), pp. 1090 to 1095). This is considered to be because, when circular plasma fluctuates in the chamber, induction coupling may not be maintained in an area in which the distance between the circular plasma and the coil becomes excessively large and in which insufficient gas is supplied. And as a result the plasma is lost.

Meanwhile, in Embodiment 1, gap g between the lowermost surface of first quartz block 4 that constitute opening portion 8 of plasma torch unit T and the surface of base material 2 is reduced. Therefore, generated plasma P may not intrude into the gap between the lowermost surface of first quartz block 4 of plasma torch unit T and base material 2, and remains on the inside (a region on the upstream side of the gap) of the circular chamber. Therefore, even when the gas flux increases, circular plasma P is maintained extremely stably, Therefore, compared to the examples of the related art, Embodiment 1 enables significantly stabilized generation of plasma.

In addition, by reducing gap g, base material 2 can be exposed to plasma which has a high electron density and a high active particle density among generated plasma P. Therefore, high-speed plasma processing or high-temperature plasma processing can be performed.

Furthermore, it was found that, when gap g between the lowermost surface of first quartz block 4 that constitute opening portion 8 and the surface of base material 2 is 1 mm or less, the fluctuation of the circular plasma P (leakage from opening portion 8) can be suppressed. On the other hand, when gap g is too small, the plasma flow which reaches base material 2, is weakened. In addition, when gap g is too small, the plasma processing fluctuates due to the influence of product processing or assembly precision. Therefore, the gap is desirably configured to be 0.1 mm or more, and preferably 0.3 mm or more.

Embodiment 2

Figure 4:
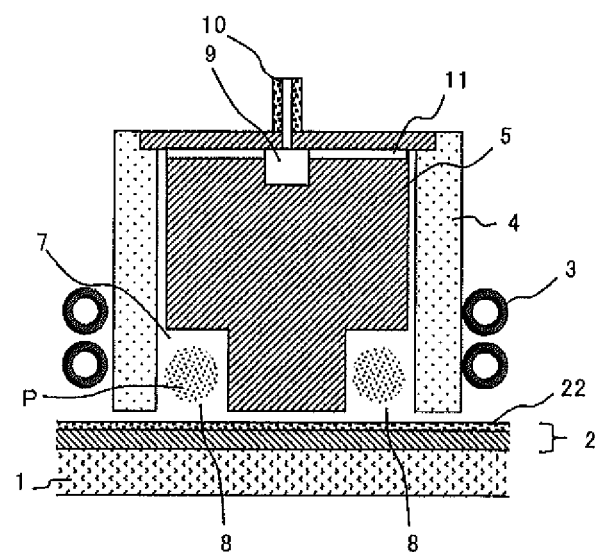
FIG. 4 is a cross-sectional view showing a configuration of a plasma processing apparatus according to Embodiment 2.

Embodiment 2 will be described with reference to FIG. 4. FIG. 4 shows a configuration of a plasma processing apparatus according to Embodiment 2. FIG. 4 is a cross-sectional view in a direction perpendicular to the longitudinal direction of an induction coupling-type plasma torch unit, and corresponds to a cross-sectional view of FIG. 1A according to Embodiment 1.

The plasma processing apparatus according to Embodiment 2 includes two linear opening portions 8. Two opening portions 8 are respectively disposed along two long sides of circular space 7 forming a circular chamber.

In the configuration of Embodiment 2, an arbitrary portion on the surface of base material 2 is exposed to plasma twice for one scanning (moving the induction coupling-type plasma torch unit T relative to base material mounting table 1). Therefore, higher-speed or higher-temperature plasma processing can be performed.

Embodiment 3

Figure 5:
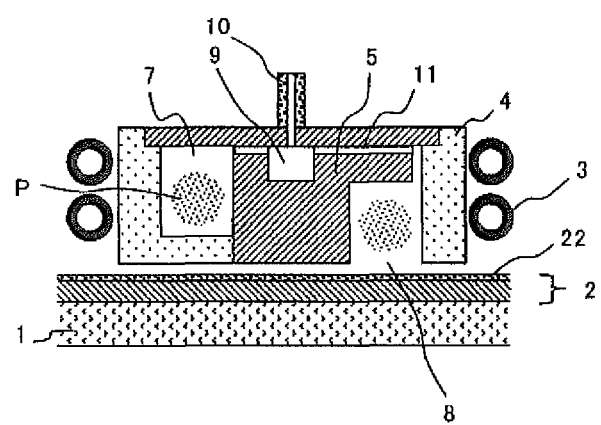
FIG. 5 is a cross-sectional view showing a configuration of a plasma processing apparatus according to Embodiment 3.

Embodiment 3 will be described with reference to FIG. 5. FIG. 5 shows a configuration of a plasma processing apparatus according to Embodiment 3. FIG. 5 is a cross-sectional view in a direction perpendicular to the longitudinal direction of an induction coupling-type plasma torch unit, and corresponds to a cross-sectional view of FIG. 1A according to Embodiment 1.

The plasma processing apparatus according to Embodiment 3 is different from the plasma processing apparatus according to Embodiment 1, regarding the shapes of first quartz block 4 and second quartz block 5. That is, the widths of first quartz block 4 and second quartz block 5 in the vertical direction of the drawing are configured to be small. With such a configuration, plasma torch unit T can be made compact.

Embodiment 4

Figure 6:
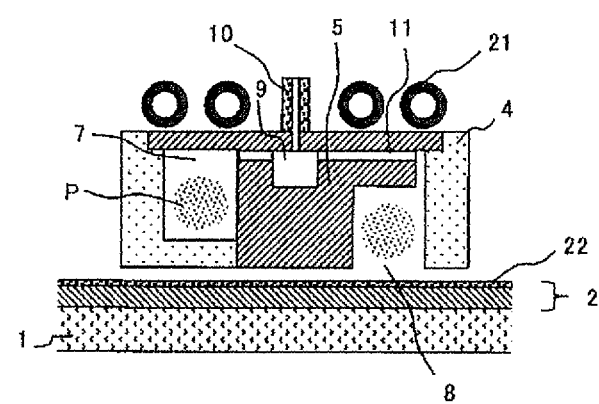
FIG. 6 is a cross-sectional view showing a configuration of a plasma processing apparatus according to Embodiment 4.

Embodiment 4 will be described with reference to FIG. 6. FIG. 6 shows a configuration of a plasma processing apparatus according to Embodiment 4. FIG. 6 is a cross-sectional view in a direction perpendicular to the longitudinal direction of an induction coupling-type plasma torch unit, and corresponds to a cross-sectional view of FIG. 1A according to Embodiment 1.

Similarly to the case of Embodiment 3, in the plasma processing apparatus according to Embodiment 4, the widths of first quartz block 4 and second quartz block 5 in the vertical direction of the drawing are configured to be small. Furthermore, the plasma processing apparatus according to Embodiment 4 includes planar spiral coil 21 which is disposed above second quartz block 5, instead of solenoid coil 3 which is disposed so as to surround the circular chamber. In this way, the coil may be disposed on the side surface of circular chamber 3 (in the drawing, on the upper surface of circular chamber 3). With such a configuration, a torch unit can be made extremely small.

Embodiment 5

Figure 7:
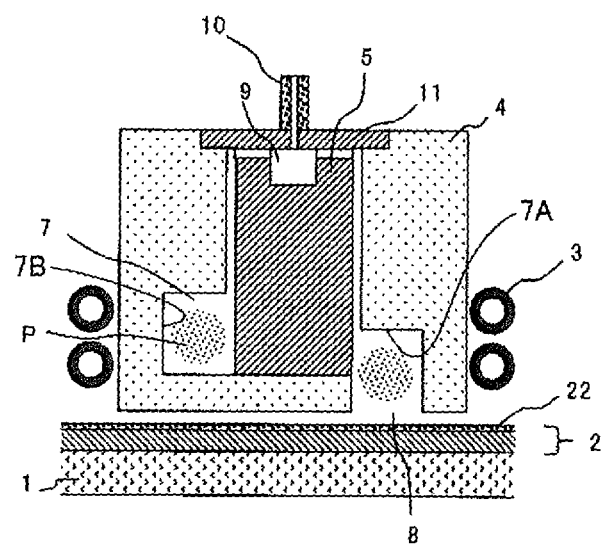
FIG. 7 is a cross-sectional view showing a configuration of a plasma processing apparatus according to Embodiment 5.

Embodiment 5 will be described with reference to FIG. 7. FIG. 7 shows a configuration of a plasma processing apparatus according to Embodiment 5. FIG. 7 is a cross-sectional view in a direction perpendicular to the longitudinal direction of an induction coupling-type plasma torch unit, and corresponds to a cross-sectional view of FIG. 1A according to Embodiment 1.

The plasma processing apparatus according to Embodiment 5 is different from the plasma processing apparatus according to Embodiment 1, regarding the shapes of first quartz block 4 and second quartz block 5. In second quartz block 5, a lower portion thereof has an elliptical cylinder shape and a cross-section which is in parallel with the mounting surface of base material mounting table 1 has the same shape (elliptical shape). First quartz block 4 has groove 7B, which faces second quartz block 5, at an intermediate portion thereof. Furthermore, first quartz block 4 includes groove 7A, which faces to base material mounting table 1, at an intermediate portion thereof. Circular space 7 forming the circular chamber is constituted by grooves 7A and 7B and the outer wall surface of second quartz block 5.

Embodiment 6

Figure 8:
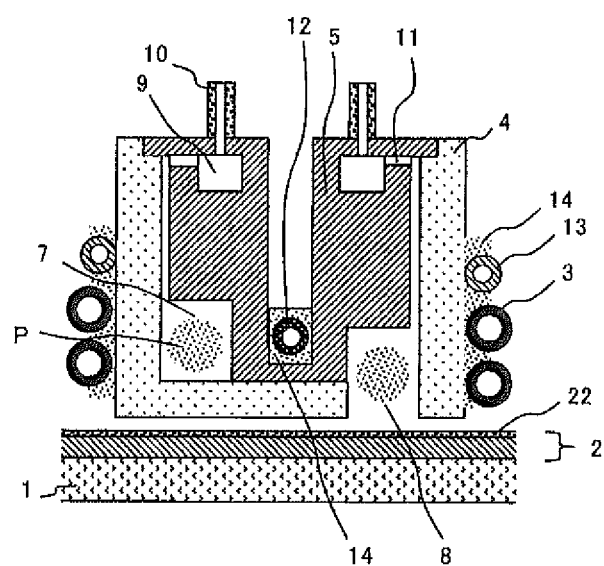
FIG. 8 is a cross-sectional view showing a configuration of a plasma processing apparatus according to Embodiment 6.

Embodiment 6 will be described with reference to FIG. 8. FIG. 8 shows a configuration of a plasma processing apparatus according to Embodiment 6. FIG. 8 is a cross-sectional view in a direction perpendicular to the longitudinal direction of an induction coupling-type plasma torch unit, and corresponds to a cross-sectional view of FIG. 1A.

The plasma processing apparatus of FIG. 8 includes copper tube 12 which is joined by adhesive 14 into an concave portion provided inside second quartz block 5. Copper tube 12 is grounded and contributes to improving ignition properties of plasma.

Copper tube 12 which is disposed in the concave portion provided inside second quartz block 5 may form a cooling medium path. By making a cooling medium flow through copper tube 12, the concave portion is cooled and the outer wall surface (the inner wall surface of the circular chamber) of second quartz block 5 in contact with plasma P is effectively cooled.

Since the concave portion is formed on the upper surface of second quartz block 5 in the drawing, two gas plasma manifolds 9 are provided to extend in a longitudinal direction of the plasma torch unit. When two plasma gas manifolds 9 are provided, there is an advantage of being able to control the gas flux balance in the two gas supply systems (plasma gas manifold 9 and plasma gas supply pipe 10).

In addition, the plasma processing apparatus of FIG. 8 includes quartz tube 13 as a dielectric tube which is joined by adhesive 14 to the outer wall surface of first quartz block 4. In addition, solenoid coil 3 is joined by adhesive 14 to the outer wall surface of first quartz block 4. When quartz tube 13 forms a cooling medium path, a cooling medium which flows through quartz tube 13 can cool solenoid coil 3 and first quartz block 4.

Embodiment 7

Figure 9:
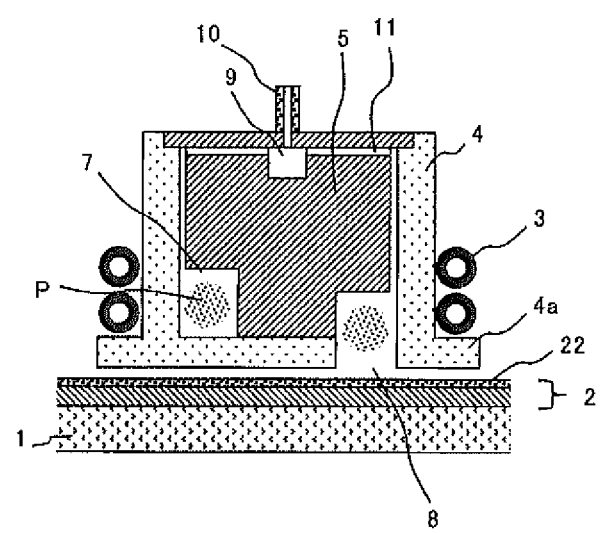
FIG. 9 is a cross-sectional view showing a configuration of a plasma processing apparatus according to Embodiment 7.

Embodiment 7 will be described with reference to FIG. 9. FIG. 9 shows a configuration of a plasma processing apparatus according to Embodiment 7. FIG. 9 is a cross-sectional view in a direction perpendicular to the longitudinal direction of an induction coupling-type plasma torch unit, and corresponds to a cross-sectional view of FIG. 1A.

The plasma processing apparatus of FIG. 9 includes protrusion portion 4a which protrudes from the lowermost surface of first quartz block 4 to the surface direction of the Base material mounting table 1. When plasma gas remains in a gap between solenoid coil 3 and base material 2, there is a concern that arc discharge may occur between plasma P and solenoid coil 3. Protrusion portion 4a suppresses the remaining of plasma gas in a gap between solenoid coil 3 and base material 2 and suppresses the occurrence of arc discharge.

Embodiment 8

Figure 10:
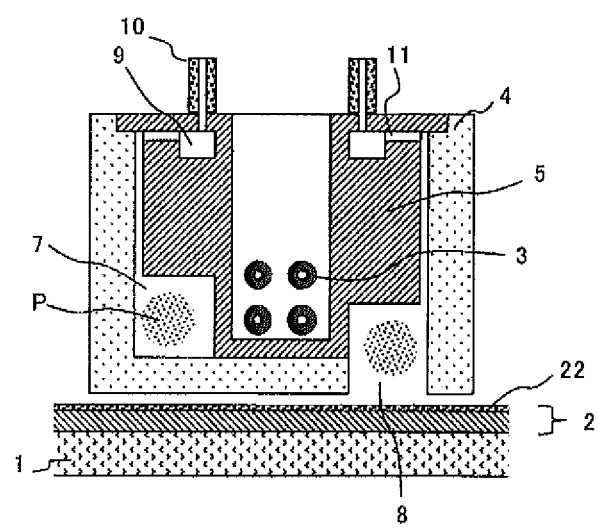
FIG. 10 is a cross-sectional view showing a configuration of a plasma processing apparatus according to Embodiment 8.

Embodiment 8 will be described with reference to FIG. 10. FIG. 10 shows a configuration of a plasma processing apparatus according to Embodiment 8. FIG. 10 is a cross-sectional view in a direction perpendicular to the longitudinal direction of an induction coupling-type plasma torch unit, and corresponds to a cross-sectional view of FIG. 1A.

The plasma processing apparatus of FIG. 10 includes solenoid coil 3 which is inserted into a concave portion provided in second quartz block 5. The winding axis of solenoid coil 3 is the vertical direction in the drawing.

With such a configuration, it is not necessary that solenoid coil 3 be provided on the outer surface of induction coupling-type plasma torch unit T. Therefore, the size of induction coupling-type plasma torch unit T can be reduced. In addition, since the visual recognition of discharge state in the circular chamber or the surface of base material 2 near opening portion 8 is improved, various kinds of monitoring such as light emitting monitoring and temperature monitoring are easily performed. Furthermore, since plasma gas does not remain in the vicinity of solenoid coil 3, the occurrence of arc discharge between plasma P and solenoid coil 3 is effectively suppressed.

Embodiment 9

Figure 11:
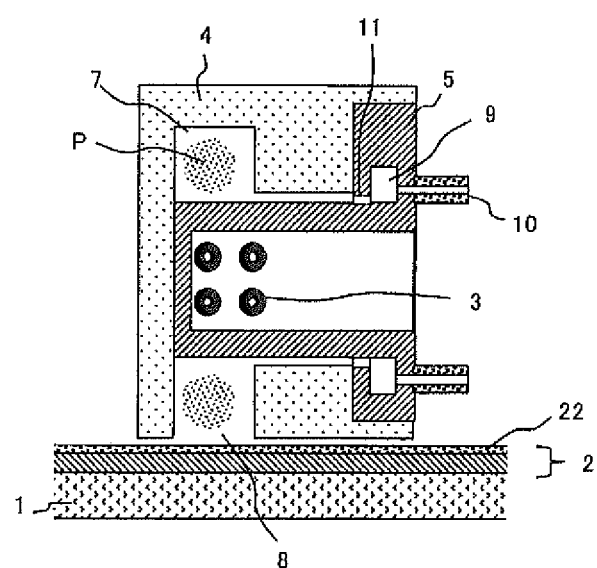
FIG. 11 is a cross-sectional view showing a configuration of a plasma processing apparatus according to Embodiment 9.

Embodiment 9 will be described with reference to FIG. 11. FIG. 11 shows a configuration of a plasma processing apparatus according to Embodiment 9. FIG. 11 is a cross-sectional view in a direction perpendicular to the longitudinal direction of an induction coupling-type plasma torch unit, and corresponds to a cross-sectional view of FIG. 1A.

The plasma processing apparatus of FIG. 11 includes solenoid coil 3 which is disposed inside a concave portion provided inside second quartz block 5. The winding axis of solenoid coil 3 is the horizontal direction on the paper surface in the drawing. That is, Embodiment 9 has a configuration in which the winding axis of solenoid coil 3 is parallel to the surface of base material 2; and a circular plane which is constituted by circular space 7 formed by the circular chamber is perpendicular to the surface of base material 2.

With such a configuration, the size of induction coupling-type plasma torch unit T can be reduced. In addition, since the visual recognition of discharge state in the circular chamber or the surface of base material 2 near opening portion 8 is improved, various kinds of monitoring such as light emitting monitoring and temperature monitoring are easily performed. Furthermore, since plasma P and solenoid coil 3 are spatially separated, the occurrence of arc discharge between plasma P and solenoid coil 3 can be efficiently suppressed.

Embodiment 10

Figure 12A:
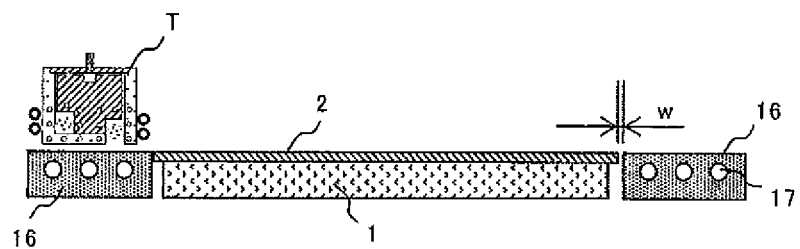
FIGS. 12A to 12C are cross-sectional views showing a configuration of a plasma processing apparatus according to Embodiment 10.
Figure 12B:
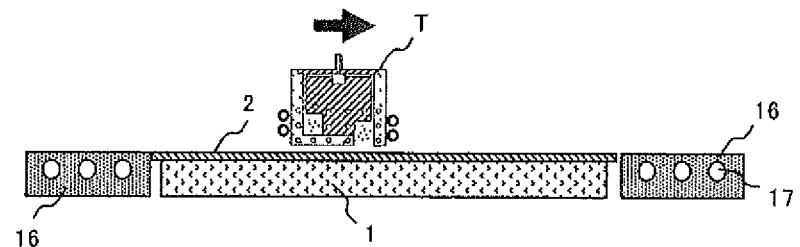
Figure 12C:
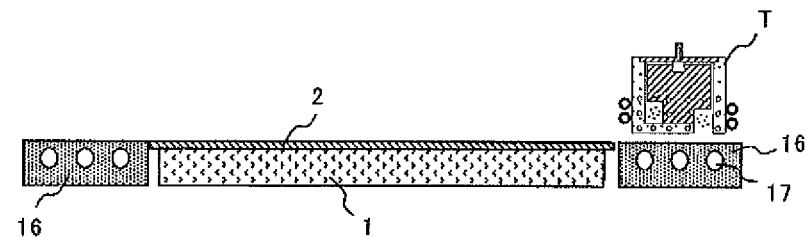

Embodiment 10 will be described with reference to FIGS. 12A to 12C. FIGS. 12A to 12C is a cross-sectional view showing a configuration of a plasma processing apparatus according to Embodiment 10. The plasma processing apparatus according to Embodiment 10 includes induction coupling-type plasma torch unit T, base material mounting table 1, and planar cover 16. Plasma torch unit T show in FIGS. 12A to 12C is the same as that of Embodiment 1.

As shown in FIGS. 12A to 12C, planar covers 16 are provided adjacent to both ends of base material mounting table 1. Cover 16 is provided in the vicinity of base material mounting table 1 so as to surround edge portions of base material 2 mounted on base material mounting table 1. In addition, the surface of cover 16 and the surface of base material 2 are disposed on the same plane. Gap w between base material 2, mounted on base material mounting table 1, and cover 16 is desirably as small as possible.

Cooling medium path 17 for cooling cover 16 is provided inside cover 16. Cover 16 is provided facing to the vicinity of an opening portion of plasma torch unit T. Therefore, the leakage of plasma P, generated in the circular chamber, from the circular chamber is suppressed, and plasma torch unit T is protected from plasma. In addition, since cover 16 defines a circular space of circular chamber 16 with the opening portion, ignition and extinction of plasma is smooth.

It is preferable that at least a surface (surface opposite to plasma torch unit T) of cover 16 be formed of an insulating material. With such a configuration, the occurrence of arc discharge between plasma and cover 16 can be effectively suppressed. Cover 16 may be formed of only an insulating material such as quartz or ceramics, or cover 16 or may be formed of a metal (conductor) such as stainless steel or aluminum on which an insulating film is formed by thermal irradiation, CVD, coating, and the like.

FIG. 12A shows a preliminary step in which plasma torch unit T is disposed facing to cover 16 and the ignition sequence and acceleration of plasma torch unit T are performed. FIG. 12B shows a state in which plasma torch unit T scans the surface of base material 2 and a step in which the plasma processing is being performed. FIG. 12C shows a step in which plasma torch unit T is disposed facing to cover 16 and the deceleration and extinction of plasma torch unit T is performed.

Embodiment 11

Figure 13:
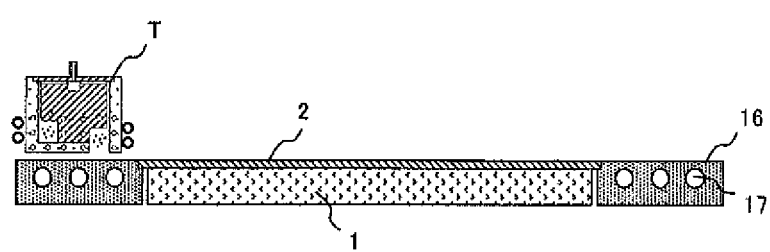
FIG. 13 is a cross-sectional view showing a configuration of a plasma processing apparatus according to Embodiment 11.

Embodiment 11 will be described with reference to FIGS. 13 and 14. FIG. 13 shows a configuration of a plasma processing apparatus according to Embodiment 11. Similarly to the case of Embodiment 10, the plasma processing apparatus according to Embodiment 11 includes induction coupling-type plasma torch unit T, base material mounting table 1, and planar cover 16. Plasma torch T shown in FIGS. 13 and 14 is the same as that of Embodiment 1.

FIG. 13 shows a preliminary step in which the ignition sequence and acceleration of induction coupling-type plasma torch unit T is performed. Planar covers 16 are provided adjacent to both ends of base material mounting table 1. Cover 16 has a function of protecting the apparatus from plasma and a function of maintaining the shape of the circular chamber in a given shape so as to control unstable plasma and extinction.

Figure 14:
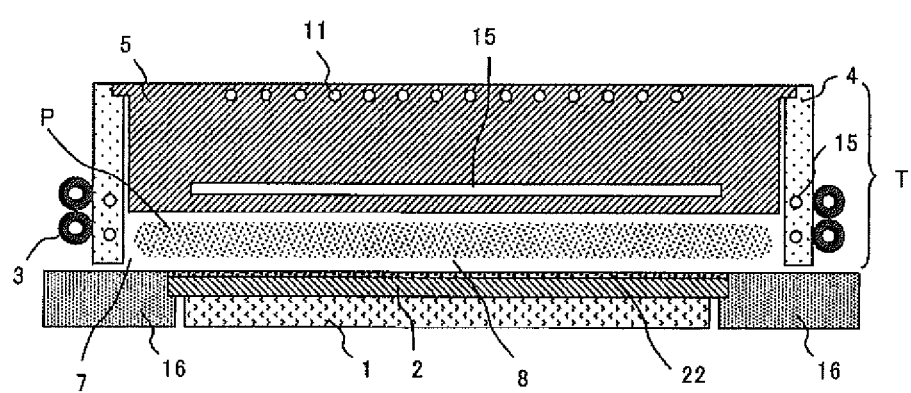
FIG. 14 is a cross-sectional view showing a configuration of the plasma processing apparatus according to Embodiment 11.

FIG. 14 shows the relationship between plasma torch unit T, and base material mounting table 1 and planar cover 16 in the plasma processing apparatus according to Embodiment 11. FIG. 14 is a cross-sectional view which is parallel to the longitudinal direction of induction coupling-type plasma torch unit T and is perpendicular to a base material, and corresponds to FIG. 1D.

The plasma processing apparatus according to Embodiment 10 has gap w between base material 2, mounted on base material mounting table 1, and cover 16, but the plasma processing apparatus according to Embodiment 11 is configured to have no gap (refer to FIGS. 13 and 14). In Embodiment 10, when induction coupling-type plasma torch unit T scans the vicinity of gap w, plasma may fluctuate or be extinguished. In Embodiment 11, the fluctuation and extinction of plasma can be effectively suppressed.

In order to remove gap w between base material 2 and cover 16, for example, cover 16 is configured to move. That is, after mounting base material 2 on base material mounting table 1, cover 16 may be slowly moved toward and come into contact with base material 2. Cover 16 may be moved by a motor driving mechanism, an air driving mechanism, a spring driving mechanism, or the like.

In addition, as show in FIG. 14, when the length of opening portion 8 is the same as or larger than the width of base material 2, the vicinity of the surface of thin film 22 on the entire surface of base material 2 can be treated at one scanning (that is, moving induction coupling-type plasma torch unit T relative to base material mounting table 1).

A coupling medium path may not be provided inside cover 16 shown in FIG. 14. Since the time for which plasma torch unit T passes through cover 16 is short, heat energy to be applied to cover 16 can be reduced. Therefore, a cooling medium path is not necessarily provided in cover 16. Of course, a cooling medium path may be provided according to a desired process.

Embodiment 12

Figure 15:
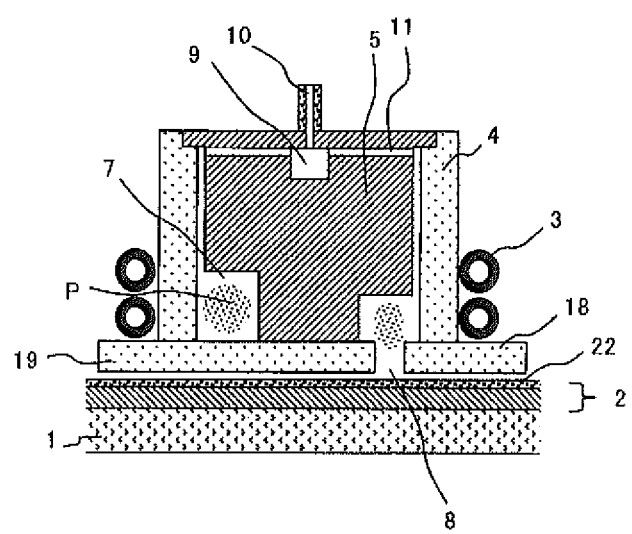
FIG. 15 is a cross-sectional view showing a configuration of a plasma processing apparatus according to Embodiment 12.

Embodiment 12 will be described with reference to FIG. 15. FIG. 15 shows a configuration of a plasma processing apparatus according to Embodiment 12. FIG. 15 is a cross-sectional view in a direction perpendicular to the longitudinal direction of an induction coupling-type plasma torch unit, and corresponds to a cross-sectional view of FIG. 1A.

The plasma processing apparatus of FIG. 15 includes first quartz block 4 and second quartz block 5 that constitute the lowermost surface of induction coupling-type plasma torch unit T. First quartz block 4 and second quartz block 5 define circular space 7 forming the circular chamber. Furthermore, at least one of third quartz block 18 and fourth quartz block 19 is configured to be able to slide in the horizontal direction of the drawing. As a result, opening width f of linear opening portion 8 can be controlled.

With such a configuration, the intensity of plasma exposed to base material 2 or process parameters such as the exposing time of plasma can be controlled.

Embodiment 13

Figure 16:
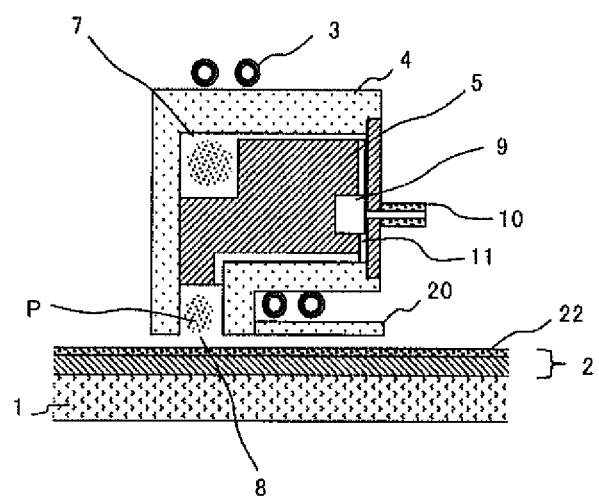
FIG. 16 is a cross-sectional view showing a configuration of a plasma processing apparatus according to Embodiment 13.
Figure 17:
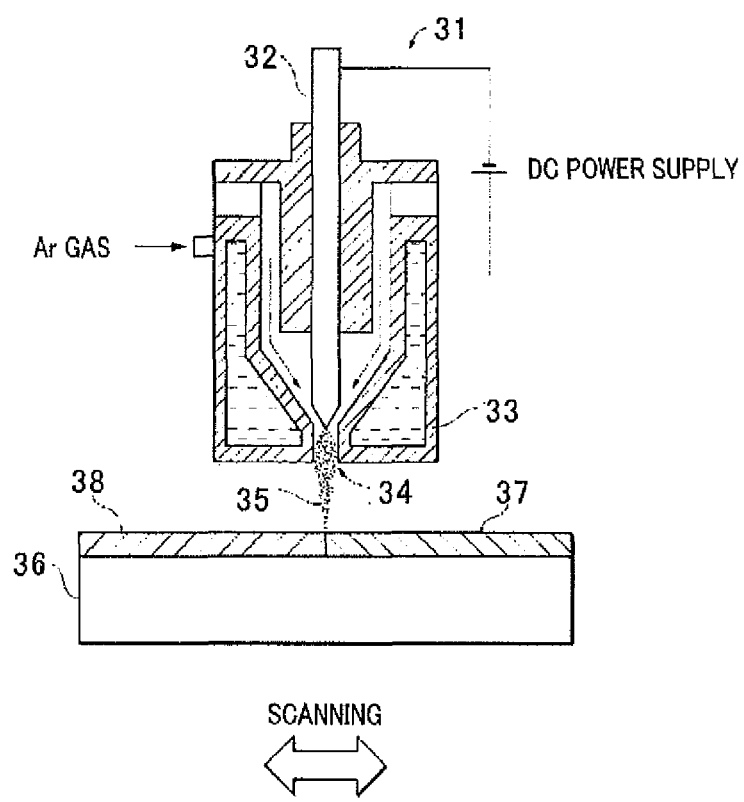
FIG. 17 is a cross-sectional view showing a configuration of a plasma processing apparatus according to an example of the related art.
Figure 18:
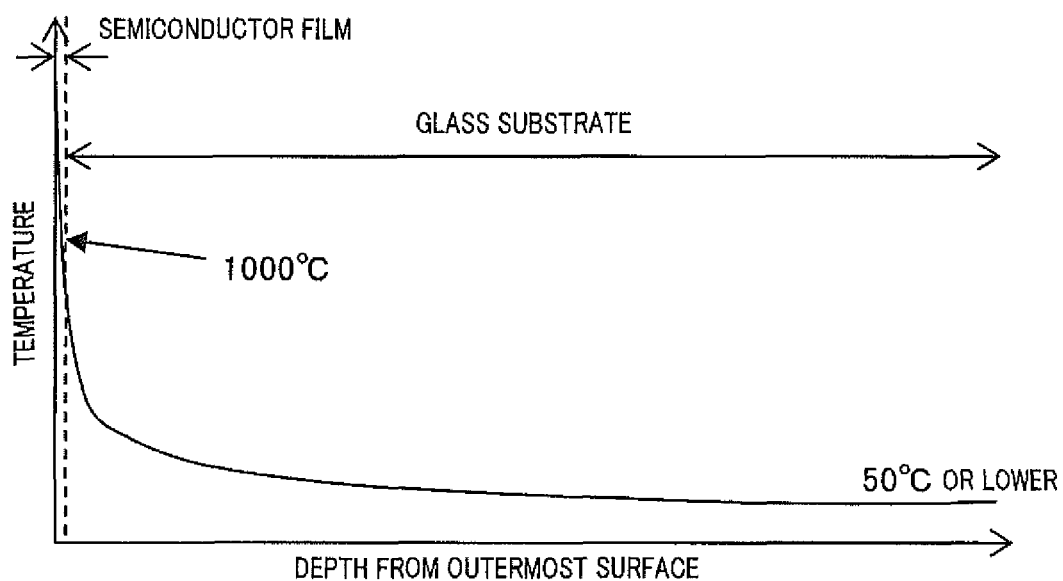
FIG. 18 is a conceptual view showing the relationship between the depth from the outermost surface and temperature in the example of the related art.

Embodiment 13 will be described with reference to FIG. 16. FIG. 16 shows a configuration of a plasma processing apparatus according to Embodiment 13. FIG. 16 is a cross-sectional view in a direction perpendicular to the longitudinal direction of an induction coupling-type plasma torch unit, and corresponds to a cross-sectional view of FIG. 1A.

The plasma processing apparatus of FIG. 16 includes solenoid coil 3, and the winding axis of solenoid coil 3 is the horizontal direction on the paper surface in the drawing. Similarly to the case of Embodiment 9, the winding axis of solenoid coil 3 is parallel to the surface of base material 2; and a circular plane which is constituted by circular space 7 formed by the circular chamber is perpendicular to the surface of base material 2. The winding axis of solenoid coil 3 is not exactly perpendicular but is slightly inclined to the circular plane formed by circular space 7. However, since solenoid coil 3 is sufficiently close to the circular chamber, high-density plasma can be generated in circular space 7 constituted by the circular chamber.

Dielectric block 20 is provided between solenoid coil 3 and base material 2. Dielectric block 20 prevents charged particles supplied from plasma, from reaching solenoid coil 3.

With such a configuration, the size of induction coupling-type plasma torch unit T can be reduced. In addition, since the visual recognition of discharge state in the circular chamber or the surface of base material 2 immediately below opening portion 8 is improved, various kinds of monitoring such as light emitting monitoring and temperature monitoring are easily performed. Furthermore, since plasma P and solenoid coil 3 are spatially separated, the occurrence of arc discharge between plasma P and solenoid coil 3 can be efficiently suppressed.

The plasma processing apparatuses and methods described above simply exemplify typical examples in the applicable range of the present invention.

For example, induction coupling-type plasma torch unit T may scan fixed base material mounting table 1, but base material mounting table 1 may also scan fixed induction coupling-type plasma torch unit T.

In addition, the use of an ignition source is also possible in order to facilitate the ignition of plasma. As the ignition source, an ignition spark apparatus which is used for a gas water heater or the like can be used.

In addition, the chamber of plasma torch unit T may not be a long circular chamber. A cylindrical circular chamber which is close to perfect circle may be adopted using a cylindrical quartz block, cylindrically molded solenoid coil 3 made of a conductor, and the like.

As described above, the plasma processing apparatus according to the present invention includes the coil which is provided near the dielectric member defining the circular chamber. The coil which is provided near the dielectric member defining the circular chamber includes, for example, 1) the coil which is provided so as to cover the outside surface of the circular space constituted by the circular chamber (refer to FIGS. 1A to 1D, 4, 5, 7, 8, and 9); 2) the coil which is disposed in the space surrounded by the circular space constituted by the circular chamber (refer to FIGS. 10 and 11); and 3) the coil which is disposed on the upper surface or lower surface of a circle of the circular space constituted by the circular chamber (refer to FIG. 6).

When base material 2 is a conductor or a semiconductor or when thin film 22 is a conductor or a semiconductor, arc discharge is likely to occur on the surface of base material 2 or thin film 22. In order to suppress the occurrence of arc discharge, after forming an insulating film on the surface to be treated of base film 2 or thin film 22, the surface of base material 2 or thin film 22 may be treated through the insulating film.

The term "thermal plasma process" described in the specification of the present application is termed not as a process of thermal plasma, thermal equilibrium plasma, or high-temperature plasma, but as a process of irradiating high-temperature plasma. It is difficult to strictly differentiate thermal plasma and low-temperature plasma. In addition, for example, as described in "Non-equilibrium in thermal plasma", Yasunori Tanaka, Journal of Plasma and Fusion Research, Vol. 82, No. 8 (2006), pp. 479 to 483, it is also difficult to differentiate the kinds of plasma using only thermal equilibrium.

Using the plasma processing apparatuses having various configurations according to the present invention, the vicinity of the surface of base material 2 can be treated at a high temperature.

For example, the plasma processing according to the present invention can be applied to crystallization of a TFT semiconductor film which is described above in Background Art or the modification of a solar cell semiconductor film. In addition, as a method of manufacturing a solar cell, the plasma processing according to the present invention can also be applied to a method in which powder obtained by crushing a silicon ingot is coated on a base material, and melted by irradiating plasma, thereby obtaining a polycrystalline silicon film. Furthermore, the plasma processing according to the present invention can be applied to a variety of surface treatments such as the cleaning or degassing reduction of a protective layer in a plasma display panel, the surface flattening or degassing reduction of a dielectric layer constituted by a collection of silica fine particles, the reflow of a variety of electric devices, and plasma doping using a solid impurity source.

Using the plasma processing according to the present invention, a high-temperature plasma processing in which the vicinity of the surface of the base material is uniformly treated only for an extremely short period of time thermally at a high temperature can be performed; and furthermore, a low-temperature plasma processing in which a base material is irradiated with plasma from reaction gas or plasma and a reaction gas at the same time can be performed. By generating plasma in the gas mixture of plasma gas and reaction gas, base material 2 can be etched or a film can be formed on base material 2 by CVD. A plasma processing such as etching, CVD, or doping can also be realized by using a noble gas or a mixed gas obtained by adding a small amount of hydrogen gas to a noble gas as the plasma gas, and supplying a gas including the reaction gas as the shielding gas.

The reaction gas used for etching is selected according to the material of base material 2 to be etched; and when silicon or a silicon compound is etched, the reaction gas may be halogen-containing gas, for example, $C_xF_y$ (wherein x and y represent natural numbers) and $SF_6$.

When oxygen gas is used as the reaction gas, removal of an organic substance, resist ashing, and the like become possible. The reaction gas used for CVD is selected according to the material of a film to be formed; and when the film is formed of silicon or a silicon compound, the reaction gas may be, for example, monosilane, disilane, and the like. When a silicon oxidized film is formed, the reaction gas may be a gas mixture of an organic gas including silicon, represented by tetraethoxysilane (TEOS), and oxygen gas.

When a gas mainly including argon gas is used as the plasma gas, thermal plasma can be generated. Meanwhile, when a gas mainly including helium gas is used as the plasma gas, plasma having a relatively low temperature can be generated.

Additionally, using the plasma processing according to the present invention, water repellency or hydrophilic properties of surface of base material 2 can be modified with a variety of low-temperature plasma processing.

When compared to the plasma processing apparatuses of the related art (for example, described in PTL 10), since the plasma processing apparatuses according to the present invention is an induction coupling type so that it is hard to transit to an arc discharge even when a high power density per unit volume is injected. Therefore, a higher-power-density plasma can be generated and, consequently, a fast reaction rate is obtained, and all of desired regions to be treated of a base material can be efficiently treated within a short period of time.

INDUSTRIAL APPLICABILITY

The plasma processing apparatus according to the present invention can generate plasma stably and efficiently and can efficiently heat all of desired regions to be treated of a base material within a short period of time.

REFERENCE SIGNS LIST

1 Base material mounting table
2 Base material
T Induction coupling-type plasma torch unit 3 Solenoid coil
4 First quartz block
5 Second quartz block
7 Space in circular chamber
8 Opening
9 Plasma gas manifold
10 Plasma gas supply pipe
11 Plasma gas supply hole
15, 17 Cooling medium path
P Plasma
22 Thin films

The invention claimed is:

1. A plasma processing apparatus comprising;
an induction coupling-type plasma torch unit that includes
a dielectric member that defines a ring-shape chamber constituting ring-shape space which communicates with an opening portion having an opening width of 1 mm or more,
a gas supply pipe that introduces gas into an inside of the ring-shape chamber, and
a coil that is provided in a vicinity of the dielectric member defining the ring-shape chamber;
a high-frequency power supply that is connected to the coil; and
a base material mounting table that is configured to be mounted with a base material near the opening portion, wherein a distance between an end surface of the opening portion and a base material is 1 mm or less, wherein
the dielectric member has an outside dielectric block that defines an outside boundary of the ring-shape space; and an inside dielectric block that is inserted into the outside dielectric block and defines an inside boundary of the ring-shape space,
the shape of the ring-shaped space is a continuous loop having straight portions constituted by two long sides and two short sides connected to both ends of the straight portions, the two short sides being semicircular, semielliptical, or linear, and
the opening portion is a linear rectangular opening portion provided along only one of the two long sides constituting the straight portions, the opening portion opening towards a direction perpendicular to the longitudinal direction of the one of the two long sides.

2. The plasma processing apparatus according to claim 1, wherein:
the ring-shape chamber has a long shape;
the opening portion has a long and linear shape;
the coil has a long shape in parallel with a longitudinal direction of the opening portion; and
a moving mechanism, that is configured to move the chamber relative to the base material mounting table perpendicularly with respect to the longitudinal direction of the opening portion, is provided.

3. The plasma processing apparatus according to claim 1, wherein a length of the opening portion is shorter than a long axis diameter of the ring-shape space constituted by the ring-shape chamber.

4. The plasma processing apparatus according to claim 2, further comprising a cooling medium path that is provided in parallel with the longitudinal direction of the opening portion in an inside of the dielectric member.

5. The plasma processing apparatus according to claim 2, further comprising a dielectric tube that is joined to the dielectric member, is disposed in parallel with the longitudinal direction of the opening portion, and has an inside forming an cooling medium path.

6. The plasma processing apparatus according to claim 1, wherein the opening width of the opening portion is the same as a width of the ring-shape space constituted by the ring-shape chamber.

7. The plasma processing apparatus according to claim 1, wherein a long axis diameter of the ring-shape space constituted by the ring-shape chamber is 10 mm or more.

8. The plasma processing apparatus according to claim 1, further comprising a planar cover that is provided in a vicinity of the base material mounting table so as to surround an edge portion of a base material when the base material is mounted on the base material mounting table.

9. The plasma processing apparatus according to claim 8, wherein a surface of the cover and a surface of the base material mounted on the base material mounting table are disposed on the same plane.

10. The plasma processing apparatus according to claim 8, wherein at least a surface of the cover is formed of an insulating material.

* * * * *